United States Patent
Refai-Ahmed et al.

(10) Patent No.: US 10,262,920 B1
(45) Date of Patent: Apr. 16, 2019

(54) STACKED SILICON PACKAGE HAVING A THERMAL CAPACITANCE ELEMENT

(71) Applicant: Xilinx, Inc., San Jose, CA (US)

(72) Inventors: Gamal Refai-Ahmed, Santa Clara, CA (US); Suresh Ramalingam, Fremont, CA (US); Brian D. Philofsky, Longmont, CO (US); Anthony Torza, Oakland, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/369,607

(22) Filed: Dec. 5, 2016

(51) Int. Cl.
| H01L 23/22 | (2006.01) |
| H01L 23/24 | (2006.01) |
| H01L 23/427 | (2006.01) |
| H01L 23/055 | (2006.01) |
| H01L 23/367 | (2006.01) |
| H01L 23/10 | (2006.01) |

(52) U.S. Cl.
CPC ........ *H01L 23/4275* (2013.01); *H01L 23/055* (2013.01); *H01L 23/10* (2013.01); *H01L 23/3672* (2013.01); *H01L 23/427* (2013.01)

(58) Field of Classification Search
CPC ... H01L 23/4275; H01L 23/10; H01L 23/055; H01L 23/3672; H01L 23/427
See application file for complete search history.

(56) References Cited

U.S. PATENT DOCUMENTS

| 5,588,483 | A * | 12/1996 | Ishida | F28D 15/02 165/104.33 |
| 6,196,003 | B1 * | 3/2001 | Macias | F25B 21/02 257/E23.082 |
| 9,639,126 | B2 * | 5/2017 | Senyk | G06F 1/203 |
| 2003/0000689 | A1 * | 1/2003 | Kuo | F28D 20/02 165/185 |
| 2005/0055175 | A1 * | 3/2005 | Jahns | G05B 23/0254 702/182 |
| 2006/0124280 | A1 * | 6/2006 | Lee | F28D 15/0233 165/104.26 |
| 2007/0006992 | A1 * | 1/2007 | Liu | F28D 15/0266 165/104.26 |
| 2008/0014482 | A1 * | 1/2008 | Yamamiya | H01M 8/04007 429/421 |
| 2008/0316344 | A1 * | 12/2008 | Yamamiya | G02B 7/09 348/294 |

(Continued)

OTHER PUBLICATIONS

Specification and drawings for U.S. Appl. No. 14/867,349, filed Sep. 28, 2015, Refai-Ahmed et al.

(Continued)

*Primary Examiner* — Ismail A Muse

(74) *Attorney, Agent, or Firm* — Keith Taboada

(57) ABSTRACT

Chip packages and electronic devices are provided that include a thermal capacitance element that improves the operation of IC dies at elevated temperatures. In one example, a chip package is provided that includes an integrated circuit (IC) die, a lid thermally connected to the IC die, and a thermal capacitance element thermally connected to the lid. The thermal capacitance element includes a container and a capacitance material sealingly disposed in the container. The capacitance material has a phase transition temperature that is between 80 and 100 percent of a maximum designed operating temperature in degrees Celsius of the IC die.

21 Claims, 6 Drawing Sheets

(56) References Cited

U.S. PATENT DOCUMENTS

| | | | | |
|---|---|---|---|---|
| 2009/0084525 A1* | 4/2009 | Satou | F28D 15/0266 | 165/104.21 |
| 2009/0314473 A1* | 12/2009 | Yoshikawa | H01L 23/4006 | 165/104.31 |
| 2011/0056650 A1* | 3/2011 | Ito | F28D 15/00 | 165/67 |
| 2013/0056178 A1* | 3/2013 | Matsunaga | F28D 15/0233 | 165/104.21 |
| 2014/0043751 A1* | 2/2014 | Merz | G02F 1/133308 | 361/679.47 |
| 2014/0151871 A1 | 6/2014 | Refai-Ahmed | | |
| 2014/0182817 A1* | 7/2014 | Yu | G06F 1/20 | 165/104.21 |
| 2014/0362524 A1* | 12/2014 | Kim | F28D 15/02 | 361/679.47 |
| 2015/0220122 A1* | 8/2015 | Rhee | G06F 1/203 | 361/679.52 |
| 2015/0271908 A1* | 9/2015 | Arora | H05K 7/20336 | 361/679.52 |
| 2015/0326153 A1* | 11/2015 | Gohara | H02P 6/002 | 318/400.2 |
| 2016/0019937 A1 | 1/2016 | Arora et al. | | |
| 2017/0186667 A1* | 6/2017 | Choudhury | H01L 23/473 | |
| 2017/0303433 A1* | 10/2017 | Delano | H04B 1/3827 | |

OTHER PUBLICATIONS

Shi, Bing et al., "Hybrid 3D-IC Cooling System Using Micro-Fluidic Cooling and Thermal TSV's," Proc. of the 2012 IEEE Computer Society Annual Symposium on VLSI, Aug. 19, 2012, pp. 33-38, IEEE, Piscataway, New Jersey, USA.

* cited by examiner

US 10,262,920 B1

STACKED SILICON PACKAGE HAVING A THERMAL CAPACITANCE ELEMENT

TECHNICAL FIELD

Embodiments of the present disclosure generally relate to chip packages and electronic devices having the same. In particular, to chip packages and electronic devices that have a thermal capacitance element for enhanced temperature control.

RELATED ART

Electronic devices, such as tablets, computers, server, in-door telecom, out-door telecom, industrial computers, high performance computing data centers, copiers, digital cameras, smart phones, control systems and automated teller machines, among others, often employ electronic components which leverage chip packages for increased functionality and higher component density. Conventional chip packaging schemes often utilize package substrates, often in conjunction with a through-silicon-via (TSV) interposer, to enable a plurality of integrated circuit (IC) dies to be mounted to a single substrate. The IC dies may include memory, logic, MEMS, RF or other IC device.

In many instances, electronic devices are exposed to high temperature environments in which the temperature of the IC dies may be subjected to a temperatures beyond its rated operating temperature. Operation of devices above its rated operating temperature may result in erratic functionally or even permanent device failure.

Therefore, a need exists for an improved chip package, and in particular, a chip package having a thermal capacitance element that improves operation of electrical devices comprising the chip package at elevated temperatures.

SUMMARY

Chip packages and electronic devices are provided that include a thermal capacitance element that improves the operation of IC dies at elevated temperatures. In one example, a chip package is provided that includes an integrated circuit (IC) die, a thermally conductive object thermally connected to the IC die, and a thermal capacitance element thermally connected to the thermally conductive object. The thermal capacitance element includes a container and a capacitance material sealingly disposed in the container. The capacitance material is selected to change from a solid phase to a liquid phase at a target temperature of the thermal capacitance material when the IC die is below a maximum operating temperature.

In another example, a device having an integrated circuit (IC) die is provided. The device includes a housing, a first IC die disposed in the housing, and a thermal capacitance element disposed in the housing and conductively connected to the first IC die. The thermal capacitance element includes container; and a capacitance material sealingly disposed in the container. The capacitance material is selected to change from a solid phase to a liquid phase at a target temperature of the thermal capacitance material when the IC die is below a maximum operating temperature.

In another example, a device for receiving a plurality of printed circuit boards (PCBs), each PCB having at least one integrated circuit (IC) die, is provide. The device includes a chassis comprising a plurality of slots. The plurality of slots includes at least a first slot configured to receive a thermal capacitance element and a group of slots each configured to receive a PCB. A thermal carrier with good thermal conductivity such as heat pipe or vapor chamber or a tube has a fluid in it or solid material such as Copper, Diamond, graphite or other composite solid conductive material integrated with the chassis such that a portion of the heat pipe disposed adjacent each slot of the group slots is configured for transferring heat away from the group of slots to the first slot.

In yet another embodiment, a method for filling a container with a capacitance material is provided. The method includes flowing a capacitance material into a first port of a container while having a second port disposed on the opposite side of the container vented, and once a sufficient amount of the capacitance material is disposed in the container, sealing the first port and sealing the second port.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

Embodiments of the disclosure generally provide chip packages and electronic devices that include a thermal capacitance element that improves the operation of IC dies at elevated temperatures. The thermal capacitance element also improves operation at low temperatures by providing a heat reservoir that can feed energy (i.e., heat) back to the IC dies experiencing falling environmental temperatures. The thermal capacitance element must advantageously functions to substantially slow or prevent temperature rise of the IC dies within the chip package by storing energy. The thermal capacitance element stores energy by leveraging a phase change across a capacitance material disposed in the thermal capacitance element. The substantial slowing or prevention of the temperature rise allows the operation of the IC dies and electronic device therein to be extended for short periods beyond temperatures that would conventionally force the IC dies to a state that exceed its rated maximum operating temperature. The maximum operating temperature of the IC die and/or chip package is readily available from the chip manufacturer. Conversely, energy may be released from the capacitance material when operating in cold conditions, thereby slowing or preventing cooling of the IC dies within the chip package.

Figure 1:
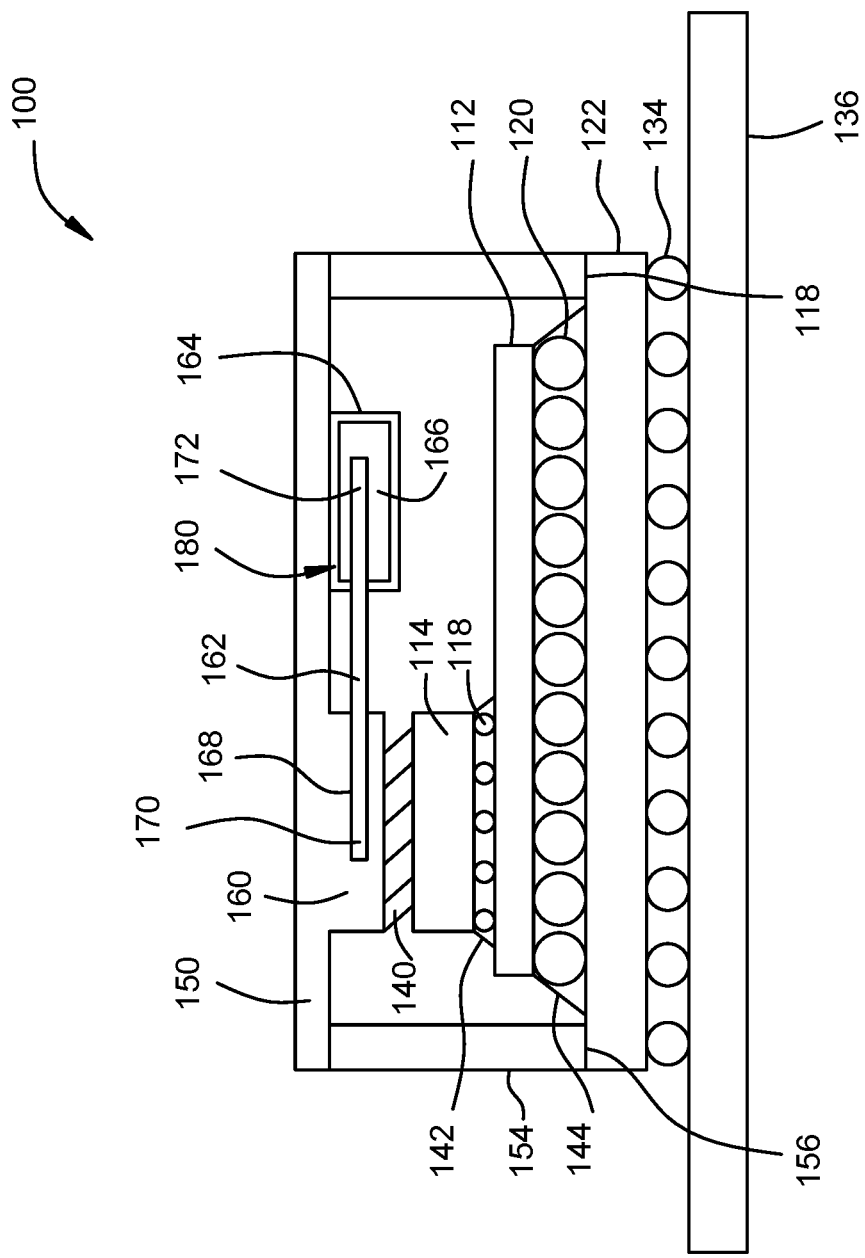
FIG. 1 is a cross sectional schematic view of an integrated chip package including an IC die interfaced with a thermal capacitance element.

Turning now to FIG. 1, an exemplary integrated chip package 100 is schematically illustrated having a thermal capacitance element 180. The chip package 100 includes at least one or more IC dies 114 connected optionally by a silicon-through-via (TSV) interposer 112 to a package substrate 122. Alternatively, the chip package 100 may have a monolithic construction, having one or more IC dies 114 connected directly to the package substrate 122, for example as flip chip ball grid array (FCBGA), ball grid array (BGA), wire bond and the like, In another alternative example, the chip package 100 may be configured to have two or more IC dies 114 in a vertically stacked configuration, also known as a 3D or stacked die package. It is contemplated that the chip package 100 may have other configurations. Although one IC die 114 is shown in FIG. 1, the number of IC dies may range from one to as many as can be fit within the chip package 100 in order to meet design criteria. The thermal capacitance element 180 functions to substantially slow or prevent the temperature rise of the IC die 114 within the chip package 100 by storing energy, thereby enabling operation of the chip package 100 to be extended for short periods beyond temperatures that would conventionally force the IC dies 114 of chip package 100 to a state that exceeds the rated maximum operating temperature of the IC dies 114.

The interposer 112 includes circuitry for electrically connecting the IC die 114 to circuitry of the package substrate 122. The circuitry of the interposer 112 may optionally include transistors. Package bumps 120, also known as "C4 bumps," are utilized to provide an electrical connection between the circuitry of the interposer 112 and the circuitry of the package substrate 122. The package substrate 122 may be mounted and connected to a printed circuit board (PCB) 136, utilizing solder balls 134, wire bonding or other suitable technique. An undermolding 144 may be utilized to fill the space not taken by the package bumps 120 between the PCB 136 and the interposer 112, thereby providing structural rigidity to the chip package 100.

Figure 6:
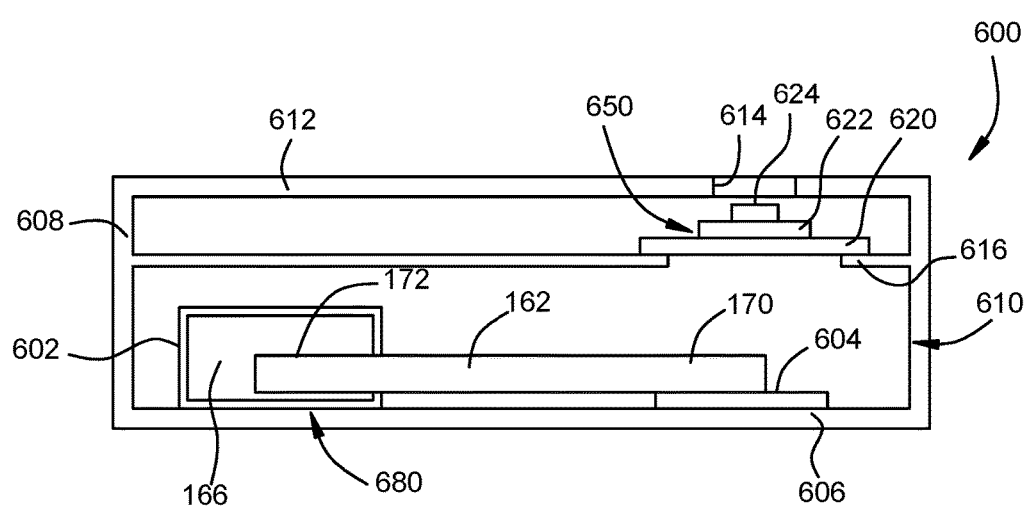
FIG. 6 is a cross sectional schematic view of an electronic device having an integrated chip package that includes a thermal capacitance element.

The IC die 114 is mounted to one or more surfaces of the interposer 112, or alternatively in embodiments wherein an interposer is not utilized, to the package substrate 122. The IC dies 114 may be programmable logic devices, such as field programmable gate arrays (FPGA), memory devices, optical devices, processors or other IC logic structures. Optical devices include photo-detectors, lasers, optical sources, and the like. In the embodiment depicted in FIG. 1, the IC die 114 is mounted to a top surface of the interposer 112 by a plurality of micro-bumps 118. The micro-bumps 118 electrically connect the circuitry of the IC die 114 to circuitry of the interposer 112. The circuitry of the interposer 112 connects the micro-bumps 118 to selective package bumps 120, and hence, connects selective circuitry of the IC die 114 to the package substrate 122, to enable communication of the IC die 114 with the PCB 136 after the chip package 100 is mounted within an electronic device (such as shown in FIG. 6). When the optional interposer 112 is not present, the micro-bumps 118 connects selective circuitry of the IC die 114 to the package substrate 122 to enable communication of the IC die 114 with the PCB 136. An undermolding 142 may be utilized to fill the space not taken by the micro-bumps 118 between the IC die 114 and interposer 112 to provide structural rigidity to the chip package 100.

The chip package 100 additionally includes a stiffener 154. The stiffener 154 is coupled to the package substrate 122 and circumscribes the IC dies 114. The stiffener 154 can extend to peripheral edges of the package substrate 122 to provide mechanical support which helps prevent the chip package 100 from bowing and warpage. The stiffener 154 may be a single layer structure or a multi-layer structure. The stiffener 154 may be made of ceramic, metal or other various inorganic materials, such as aluminum oxide ($Al_2O_3$), aluminum nitride (AlN), silicon nitride (SiN), silicon (Si), copper (Cu), aluminum (Al), and stainless steel, among other materials. The stiffener 154 can also be made of organic materials such as copper-clad laminate.

A thermally conductive object 150 is disposed over and is in thermal contact with the IC die 114. The thermally conductive object 150 may be a lid, heat spreader, heat sink or other object configured to remove or sink heat generated by the IC die 114. For the embodiments further described below, the thermally conductive object 150 will be referred to without limitation as the lid 150, although the lid 150 may alternatively be a heat spreader, heat sink or other object configured to remove or sink heat from the IC die 114.

In some embodiments, the lid 150 may be fabricated from a plastic material or other suitable material. In other embodiments particularly where it is desirable to utilize the lid 150 to receive heat from the IC die 114, the lid 150 may be fabricated from a thermally conductive material, such as copper, nickel-plated copper or aluminum, among other suitable materials. The lid 150 may have a thickness of between about 0.5 mm and about 3.0 mm, although other thicknesses may be utilized.

The lid 150 has a top surface and a bottom surface. The top surface forms the exterior top surface of the chip package 100, while the bottom surface faces the IC dies 114. A heat sink, not shown, may optionally be mounted to the top surface of the lid 150.

A pad 160 extends away from the bottom surface of the lid 150. The pad 160 and lid 150 may be separate elements, or may be fabricated as a homogeneous single mass of material. The pad 160 is thermally and/or mechanically coupled to the IC die 114 by a thermal interface material (TIM) 140. The TIM 140 may be selected to provide a thermally conductive path between the IC die 114 and the pad 160 so that heat generated by the IC dies 114 may be dissipated through the pad 160 and the lid 150.

The TIM 140 is generally a heat transfer material having a conductivity of at least about 0.3 W/m·K. Examples of materials suitable for use the TIM 140 includes thermal grease, thermally conductive epoxy, phase change materials, conductive tapes, and silicone-coated fabrics among other suitable materials. The TIM 140 may be a soft or compliant adhesive to allow compensation between mismatched heights of neighboring IC dies 114 within the chip package 100. In one example, the TIM 140 may be a thermal gel or thermal epoxy, such as for example, packaging component attach adhesives available from Al Technology, Inc., located in Princeton Junction, N.J. In another example, the TIM 140 may be a phase change material, such as Laird PCM 780.

The lid 150 may also be disposed over the stiffener 154. In some implementations, the lid 150 may be bonded to the stiffener 154 by an adhesive (not shown), such as an epoxy. In other implementations, the lid 150 located relative to the stiffener 154 by a pin that allows the elevation of the lid 150 to be mechanically decoupled from the stiffener 154. The mechanical decoupling allows the lid 150 to move freely (i.e., "float") relative to the stiffener 154. In this manner, stresses between the lid 150 and the stiffener 154 are mechanically decoupled, resulting in less warpage and delamination of the various layers and components of the chip package 100.

The thermal capacitance element 180 is thermally and mechanically coupled to the pad 160 of the lid 150 by one or more heat pipes 162. In the example depicted in FIG. 1, a first end 170 of the heat pipe 162 is disposed in an aperture (such as an blind hole or groove) 168 formed in or on the pad 160. A second end 172 of the heat pipe 162 is disposed in an aperture (or groove) formed in or on the thermal capacitance element 180. Thermal conduction between the heat pipe 162 and the pad 160 and the thermal capacitance element 180 may be enhanced by the use of TIM at their interfaces. Alternatively, the heat pipe 162 may be soldered or brazed to the pad 160 and the thermal capacitance element 180.

The heat pipe 162 has a heat transfer material sealed therein. The heat transfer material is selected to take advantage of the principles of both thermal conductivity and phase transition to efficiently manage the transfer of heat between the pad 160 and the thermal capacitance element 180. At the hot interface at the first end 170 of the heat pipe 162, i.e., the pad 160 contacting the IC die 114 through the TIM 140, the heat transfer material in a liquid phase and in contact with a thermally conductive solid surface turns into a vapor by absorbing heat from the pad 160. The vapor then travels between the hot first end 170 of the heat pipe 162 to the cold interface, i.e., the second end 172 of the heat pipe 162 disposed in the thermal capacitance element 180, and condenses back into a liquid-releasing the latent heat. The liquid then returns to the hot interface through either capillary action and/or gravity, and the cycle repeats. Due to the very high heat transfer coefficients for boiling and condensation, the heat pipe 162 highly effectively and efficiently conducts heat from the die 114 and pad 160 to the thermal capacitance element 180.

The thermal capacitance element 180 generally comprises a container 164 at least partially filled with a thermal capacitance material (TCM) 166. The container 164 may be fabricated from any material suitable to confine the TCM 166 therein. In one example, the container 164 is fabricated from a conductive material, such as a metal like aluminum, stainless steel, copper and the like. The container 164 may be attached to the lid 150 using TIM 140 or other adhesive, fastener or methodology.

The interior surfaces of the container 164 that interface with the TCM 166 may include heat transfer enhancing features. Examples of heat transfer enhancing features include texturing, ribs, protrusions, fins, grooves, dimples, divots, or other geometry that increases the surface area exposed to the TCM 166.

As defined herein, a TCM 166 is a material having a phase change point temperature (at sea level pressure) that is approximately between 70 and 100 percent less than a rated maximum operating temperature in degrees Kelvin of the chip package 100. The phase change temperature, also referred to as the target temperature, may be a freezing point, a boiling point or a triple point. In one example, the TCM 166 selected to change from a solid phase to a liquid phase at a target temperature of the TCM 166 when the IC die 114 is below a maximum operating temperature. In another example, the TCM 166 may be selected so that at least a portion the TCM 166 will be in the solid phase when the IC die 114 is rising in temperature in the temperature range defined between the lowest operating temperature of the IC die 114 and below the maximum operating temperature of the IC die 114. In another example, the TCM 166 may be selected to be in either the solid phase or in a mixed phase of solid and liquid when a temperature of the IC die 114 is rising but below the maximum operating temperature of the IC die 114. Having a mixed phase of TCM 166 near the maximum operating temperature of the IC die 114 ensures that the latent heat of the TCM 166 slows the temperature rise of the IC die 114 as the is heated close to its maximum operating temperature. In yet another example, the TCM 166 may be selected to be in a mixed phase of solid and liquid when a temperature of the IC die 114 is in the range of above the target temperature of the TCM 166 and the maximum operating temperature of the IC die. For example, the TCM 166 may be predominantly in a liquid phase when a temperature of the IC die 114 is at the maximum operating temperature of the IC die 114. In other examples, the target temperature of the TCM 166 may be within about 80% or higher of the maximum operating absolute temperature of the IC die 114.

In other examples, the TCM 166 has phase change point temperature between 278-303 degrees Kelvin less than a rated maximum operating temperature of the chip package 100. In another example, the TCM 166 has phase change point temperature between 343 and 398 degrees Kelvin. In yet another example, the TCM 166 has a solid phase at a temperature of 343 degrees Kelvin. For example, for a chip package having rated maximum operating temperature of about 373 degrees Kelvin, the TCM 166 would be selected from a material having a phase change point temperature of about 343-373 degrees Kelvin. In one example of a material suitable for the TCM 166 and phase change point temperature of about 343-373 degrees Kelvin is wax. Other examples of suitable materials for the TCM 166 include organic, inorganic and eutectic materials. Some examples of suitable organic materials for the TCM 166 include water, paraffins and fatty acids. Some examples of suitable inorganic materials for the TCM 166 include metallic, salts and hydrates. Another example of suitable organic material for the TCM 166 is paraffin 34-Carbons which has a melting temperature of about 348.9 degrees Kelvin and a latent heat of about 269 kJkg$^{-1}$K$^{-1}$. Generally, materials having higher latent heat absorb more energy, and thereby provide the chip package 100 with a longer duration of protection against temperature rise.

The amount of TCM 166 needed can be determined by the calculating the heat load (from the chip package 100) that must be sunk in order to prevent the chip package 100 from exceeding a predetermined temperature. More latent heat and higher specific heat of materials provide more thermal storage. The heat storage can be expressed as:

$$Q = m[C_{sp}(T_m - T_i) + a_m \Delta h_m + C_{lp}(T_f - T_m)]$$

wherein:
Q=quantity of heat stored (kJ)
$a_m$=fraction of TCM melted $C_{sp}$=specific heat between $T_i$ and $T_m$ (kJkg$^{-1}$K$^{-1}$)
$C_{lp}$=specific heat between $T_m$ and $T_f$ (kJkg$^{-1}$K$^{-1}$)
$\Delta h_m$=heat of fusion per unit mass (kJkg$^{-1}$)
m=mass of TCM (kg)
$T_f$=final temperature (K)
$T_i$=initial temperature (K)
$T_m$=melting temperature (K)

In one example utilizing paraffin 34-carbon as the TCM 166 where the initial temperature ($T_i$) is ~40 degrees C., $T_m$ is ~75 degrees C., the specific heat is ~3 (kJkg$^{-1}$), the latent heat is about 269 (kJkg$^{-1}$), the faction melted is about 75% so that the TCM remains in a transition phase, and the final temperature will not exceed the melting, the total heat/mass of the TCM is ~307 kJ/kg. Thus, if about 75 Watts of energy is needed to be sunk form the chip package 100, the, the mass of the TCM should be about 0.24 kg. From this, the amount of time that the chip package 100 may be maintained under it rated maximum operating condition may also be determined.

In one example of operation, the chip package 100 may be exposed to a an environment having an ambient temperature in excess of 100 degrees Celsius, such as an interior of a vehicle on a sunny day having an outside temperature of 90 degrees Celsius. The ambient heat causes the temperature of the chip package 100 to rise, which may further be increased if the chip package 100 is in use. As the temperature of the chip package 100 increases, heat from the die 114 is transferred to the pad 160 through the TIM 140. The heat in the pad 160 is transferred to the heat pipe 162, which transfers the heat to the thermal capacitance element 180. In the thermal capacitance element 180, the heat is transferred from the heat pipe 162 to the TCM 166, causing the temperature of the TCM 166 to rise. As the temperature of the TCM 166 reaches its phase change temperature, the temperature of the TCM 166 stops rising as the energy being delivered by the heat pipe 162 is utilized to change the phase of the TCM 166. Thus, heat energy which conventionally would have increased the temperature of the die 114 is instead transferred and stored in the TCM 166 as the TCM 166 undergoes a phase transformation, thereby preventing the temperature of the die 114 and ultimately the chip package 100 from appreciably rising. Accordingly, the temperature of the die 114 and the chip package 100 will temporarily remain under the maximum rated temperature while the TCM 166 is undergoing the phase transformation, thereby significantly extending the time in which the chip package 100 remains operational below its rated maximum service temperature. In one example, is thermal capacitance element 180 may extend the operation of the chip package 100 below 100 degrees Celsius for at least 2 hours as compared to chip packages without an thermal capacitance element that experience a temperature rise to 110 degrees Celsius when exposed to identical ambient temperature environments. This will be performed by determine the type of TCM and its weight based on the thermal structure of the system. This is to allow the IC will not reach 100 degrees Celsius for a target time as an example of 2 hours. This can be varied between one system to another, for example another system can be engineered for a maximum operation temperature cannot exceed 110 degrees Celsius for 20 minutes. Thus, the thermal capacitance element 180 functions to extend the time that a chip package 100 remains operational below its maximum operating temperature, while also contributing to extended live and reliability of the IC chips 114 therein.

Figure 2:
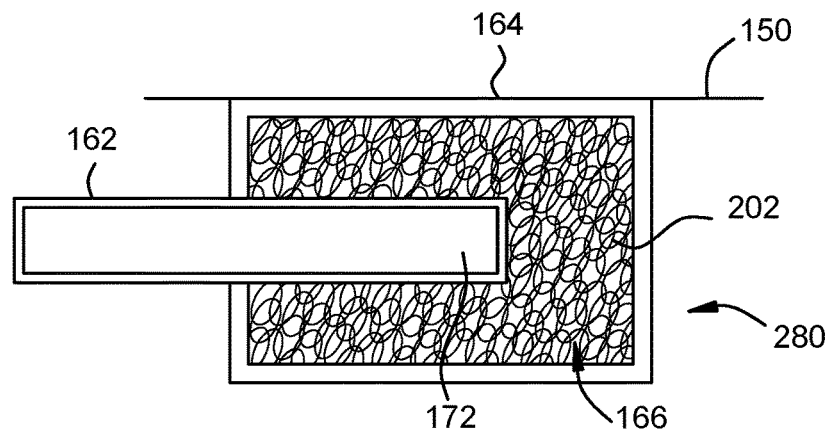
FIG. 2 is a cross sectional schematic view of one example of a thermal capacitance element that may be utilized with the integrated chip package of FIG. 1.

FIG. 2 is a cross sectional schematic view of one example of a thermal capacitance element 280 that may be utilized with the integrated chip package 100 of FIG. 1. The thermal capacitance element 280 is substantially the same of the thermal capacitance element 180, except wherein a matrix 202 of thermally conductive material is disposed in the container 164. The matrix 202 has open area wherein the TCM 166 may reside and/or flow through. The matrix 202 is also in contact with the second end 172 of the heat pipe 162. The matrix 202 is generally fabricated from a thermally conductive material, such as a metal or carbon. In one example, the matrix 202 is a plurality of corrugated expanded metallic sheets extending into the cavity defined by the container 164 in which the TCM 166 resides. In another example, the matrix 202 is a mesh of metallic fibers, such as steel wool and the like. In yet another example, the matrix 202 is metal spring. The matrix 202 improves heat transfer between the second end 172 of the heat pipe 162 and the TCM 166, thus making the thermal capacitance element 280 more responsive and function more efficiently.

Figure 3:
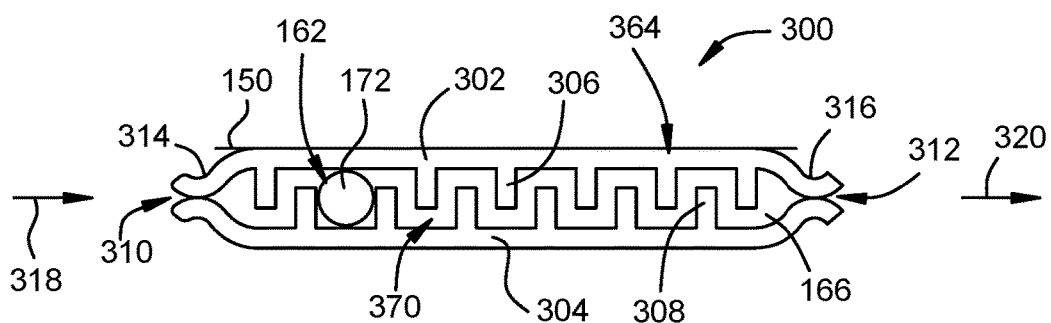
FIG. 3 is a cross sectional schematic view of another example of a thermal capacitance element that may be utilized with the integrated chip package of FIG. 1.

FIG. 3 is a cross sectional schematic view of another example of a thermal capacitance element 300 that may be utilized with the integrated chip package 100 of FIG. 1. The thermal capacitance element 300 includes a container 364 containing TCM 166 therein.

The container 364 includes a first plate 302 sealingly coupled to a second plate 304 to defined a cavity 370 therebetween in which the TCM 166 resides. In one example, the first plate 302 may be sealingly brazed, crimped, bonded, adhered or otherwise sealingly coupled to the second plate 304 in a manner that prevents leakage of the TCM 166 from the cavity 370.

The first plate 302 of the container 364 includes a plurality of fins 306 extending into the cavity 370. Similarly, the second plate 304 of the container 364 includes a plurality of fins 308 extending into the cavity 370. The fins 306, 308 may interleave in a spaced-apart relationship to allow the TCM 166 space to circulate around the fins 306, 308, thereby enhancing heat transfer.

The second end 172 of the heat pipe 162 is disposed through the container 364 and into the cavity 370. In one example, the second end 172 of the heat pipe 162 may be brazed or coupled to one or both of the plates 302, 304 to enhance heat transfer.

At opposite sides 314, 316 of the container 364, an inlet port 310 and an outlet part 312 are formed. The inlet port 310 is utilized to inject the TCM 166 into the container 364. The outlet port 312 allows air, displaced by the injecting TCM 166, to exit the cavity 370. The presence of TCM 166 exiting the outlet port 312 of the container 364 indicates that the cavity 370 is full. Once the cavity 370 is full or otherwise sufficiently loaded with the TCM 166, the port 310, 312 may be sealed. In one example, the ports 310, 312 may be sealed by plugging, crimping, epoxy, solder, brazing material, or other suitable material or technique.

The method for filling the container 364 with TCM 166 may also be described in a number of examples. In a first example, a method for filling a container with a capacitance material includes flowing a capacitance material into a first port of a container while having a second port disposed on the opposite side of the container vented. Once a sufficient amount of the capacitance material is disposed in the container, the first port and the second port are sealed. In a second example, the method of the first example may further include that the capacitance material has a phase transition temperature that is between 353 and 398 degrees Kelvin, the capacitance material being in a solid state at a temperature of 343 degrees Celsius.

In a second example, the method of the first example may further include flowing the capacitance material between interleaving fins extending from opposite interior surfaces of the container.

In a third example, the method of the first example may further include flowing the capacitance material between opposing interior textured surfaces of the container.

In a fourth example, the method of the first example may further include that opposing interior surfaces of the container are textured, and the texture may include at least one of grooves, holes, pillars and ridges.

Figure 4:
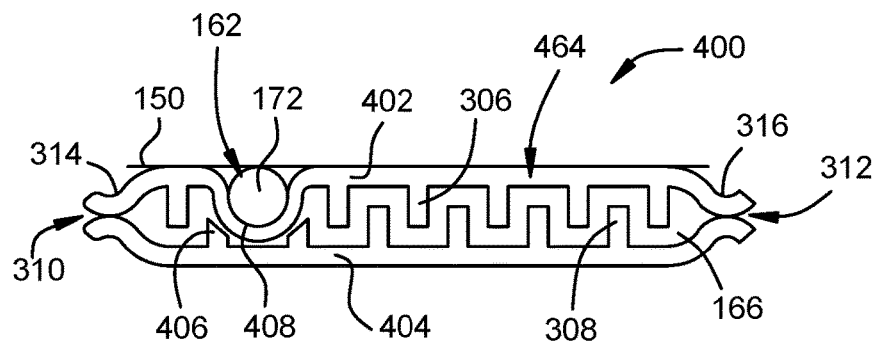
FIG. 4 is a cross sectional schematic view of another example of a thermal capacitance element that may be utilized with the integrated chip package of FIG. 1.

FIG. 4 is a cross sectional schematic view of another example of a thermal capacitance element 400 that may be utilized with the integrated chip package 100 of FIG. 1. The thermal capacitance element 400 includes a container 464 containing TCM 166 therein.

Similar to the container 364 described above, the container 464 includes a first plate 402 sealingly coupled to a second plate 404 to defined a cavity 470 therebetween in which the TCM 166 resides. In one example, the first plate 402 may be sealingly brazed, crimped, bonded, adhered or otherwise sealingly coupled to the second plate 404 in a manner that prevents leakage of the TCM 166 from the cavity 470.

The interior surfaces of the container 464 facing the cavity 470 may include heat transfer enhancing features. Examples of heat transfer enhancing features include texturing, grooves, holes, pillars and ridges, ribs, protrusions, fins, dimples, divots, or other surface area enhancing geometry.

In the example depicted in FIG. 4, the first plate 402 and second plate 404 of the container 464 includes a plurality of fins 306, 308 extending into the cavity 470. The fins 306, 308 may interleave in a spaced-apart relationship to allow the TCM 166 space to circulate around the fins 306, 308, thereby enhancing heat transfer.

The exterior of the container 464 includes a groove 408 configured to accept and mate with a second end 172 of a heat pipe 162. The second end 172 of the heat pipe 162 may be adhered to the container 464 using TIM, solder, brazing material or other suitable adhesive. In the example depicted in FIG. 4, one heat pipe 162 is shown disposed in a single groove 408. However, it is contemplated that multiple heat pipes 162 may be disposed in one or more grooves 408. Additionally, although the heat pipe 162 is shown disposed between the plate 402 and the lid 150, the groove 408 may alternatively be formed in the opposite side of the container 464.

In the example depicted in FIG. 4, TCM 166 may be loaded into the cavity 470 through an inlet port 310 formed in one side 314 of the container 464. An outlet port 312 disposed on the opposite side 316 of the container 464 allows air, displaced by the injecting TCM 166, to exit the cavity 470. The port 310, 312 may be sealed after a sufficient amount of TCM 166 is disposed in the cavity 470 such as described above.

Advantageously, having the heat pipe 162 disposed on the exterior of the container 464 reduces the potential for TCM 166 leakage from the container 464. Additionally, since the heat pipe 162 is disposed on the exterior of the container 464, the volume of the container 464 may be reduced in instances where space between the container 464 and IC dies 114 is limited.

Figure 5:
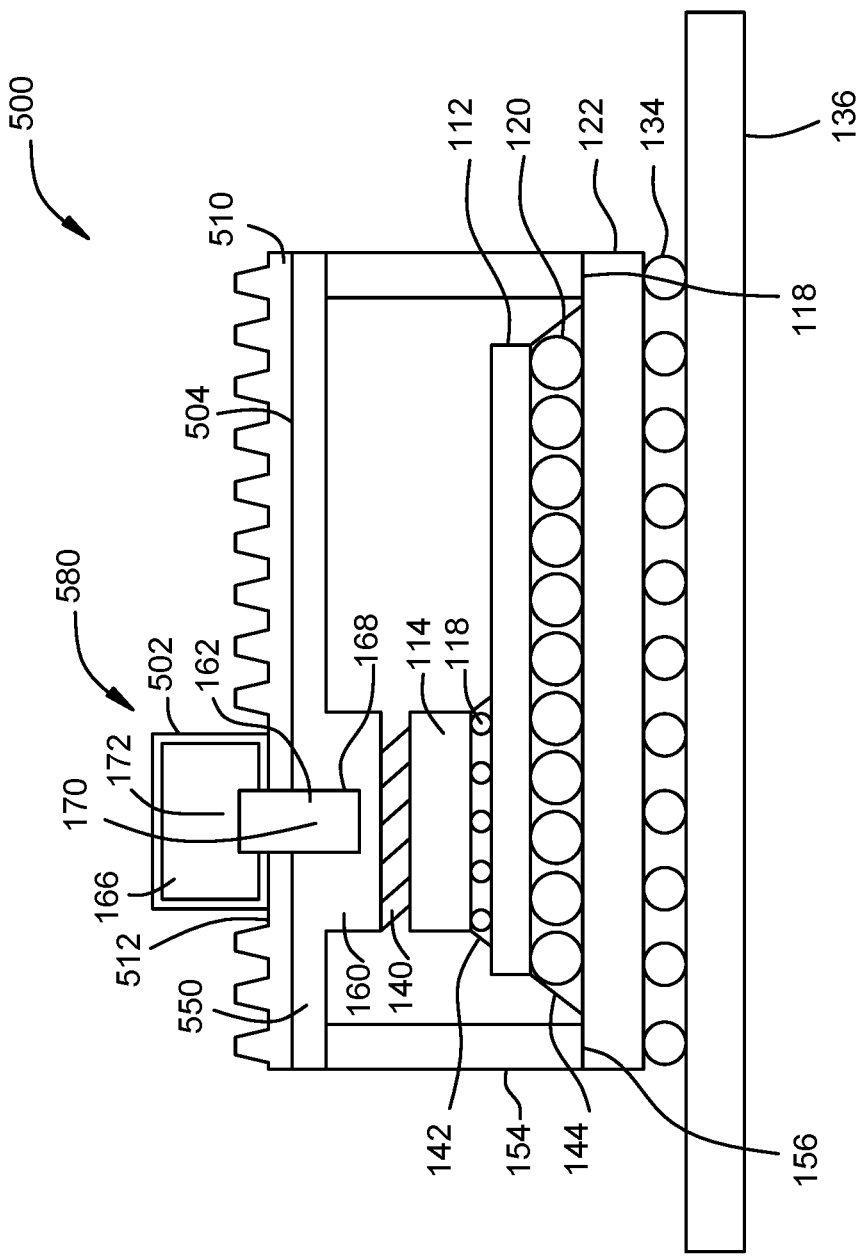
FIG. 5 is a cross sectional schematic view of another integrated chip package including an IC die interfaced with a thermal capacitance element.

FIG. 5 is a cross sectional schematic view of another integrated chip package 500 including an IC die 114 interfaced with a thermal capacitance element 580. The chip package 500 is similar to the chip package 100 described above, except in that the thermal capacitance element 580 is disposed on the opposite side of a thermal conductive object 550, for example a lid, heat spreader or heat sink (hereinafter referred to as lid 550) covering the IC 114 as compared to the thermal capacitance element 180 disposed on the same side of the lid 150 as the IC 114 covered by the lid 150 in the chip package 100.

In the example of FIG. 5, an aperture 168 formed in a pad 160 thermally contacting the IC die 114 extends through the lid 550. A first end 170 of a heat pipe 162 extends through the lid 550 and into the aperture 168. A second end 172 of the heat pipe 162 extends above the lid 550 and is disposed through a container 502 of the thermal capacitance element 580. The second end 172 of the heat pipe 162 may interface with the container 502 as described with reference to FIGS. 2-4.

The container 502 may be disposed on an exterior surface 504 of the lid 550. Heat transfer between the container 502 and the exterior surface 504 of the lid 550 may be enhanced by the use of TIM, solder, brazing material and the like disposed between the container 502 and the exterior surface 504 of the lid 550.

Alternatively, and has illustrated in FIG. 5, the container 502 may be disposed on a heat sink 510 positioned on an exterior surface 504 of the lid 550. In one example, the heat sink 510 may include a step 512 that receives and positions the container 502 on the heat sink 510. Heat transfer between the container 502, heat sink 510 and the exterior surface 504 of the lid 550 may be enhanced by the use of TIM, solder, brazing material and the like disposed between the container 502, heat sink 510 and the exterior surface 504 of the lid 550.

One advantage of having the container 502 and the exterior surface 504 of the lid 550 is that the size of the container 502 is not constrained by the geometric of the available space between the IC dies 114 and the lid 550. Thus, a larger container 502 and consequently more TCM 166 may be utilized which can function to store more heat energy and advantageously extend the period of time in that the chip package 500 remains in a state below its maximum operating temperature when exposed to a high temperature environment.

FIG. 6 is a cross sectional schematic view of an electronic device 600 having an integrated chip package 650 that is interfaced with a thermal capacitance element 680. The electronic device 600 may be a cell phone, smart phone, PDA, electronic kiosk, tablet, camera, game player, computer, lap top or other electronic device having one or more chip packages 650 therein.

In the example depicted in FIG. 6, the electronic device 600 includes a housing 610 that substantially encloses the chip package 650. The housing 610, for illustrative purposes, includes sides 608, a bottom 606 and a top 612. The housing 610 may be fabricated from a heat conducting material, such as a metal, for example, stainless steel, aluminum, mild steel and the like. Alternatively, the housing 610 may be fabricated from plastic, glass reinforced resin or other suitable material. The housing 610 includes a mounting structure 616, such as a rack, slot, ledge or other suitable structure that secures a printed circuit board (PCB) 620 on which the chip package 650 is mounted within the housing 610.

The chip package 650 may be fabricated as described above with reference to the chip package 100 of FIG. 1, except wherein the chip package 650 may optionally not include an integrated thermal capacitance element 180. Rather, the chip package 650 may be thermally serviced by the thermal capacitance element 680 located remotely from the chip package 650, but within same the housing 610 of the electronic device 600.

In one example, an image acquiring device 624, such as a camera, may be mounted to the PCB 620 or otherwise positioned within the housing 610. The image acquiring device 624 may be in communication with the chip package 650, for example, for controlling the operation of the image acquiring device 624 and/or for storing images taken by the image acquiring device 624. The image acquiring device 624 may be positioned to view objects through an aperture 614 formed in the housing 610. In one embodiment, the aperture 614 is formed in the top 612 of the housing 610.

In one example, the thermal capacitance element 680 may be mounted to the bottom 606 or other location within the housing 610. To enhance each transfer between the thermal capacitance element 680 and particularly housings 610 fabricated from metal or other similar good heat conducting materials, TIM, solder, brazing material and the like may be utilized to secure and promote heat transfer between the housing 610 and the thermal capacitance element 680. In this manner, heat from the ambient environment is funneled through the housing 610 to the thermal capacitance element 680 so that temperature rise of the chip package 650 is advantageously delayed, at least for a short period of time that enables the chip package 650 (and/or image acquiring device 624 or other heat sensitive component within the housing 602) to remain below its maximum rated operating temperature.

Optionally, to further enhance the temperature control of the chip package 650, a heat pipe 162 may be utilized to direct heat from the chip package 650 (and/or image acquiring device 624 or other heat sensitive component within the housing 602) to the thermal capacitance element 680. A first end 170 of the heat pipe 162 may be disposed through the housing 602 of the thermal capacitance element 680 so as to contact the TCM 166 disposed therein. A second end 172 of the heat pipe 162 is disposed proximate the chip package 650 (and/or image acquiring device 624 or other heat sensitive component within the housing 602). The second end 172 of the heat pipe 162 may be thermally connected to the chip package 650 via TIM or other heat transfer medium. Alternatively, the second end 172 of the heat pipe 162 may be thermally connected to the housing 602. For example, the second end 172 of the heat pipe 162 may be attached to the housing 602 using TIM, solder, brazing material or other thermally conductive material. In the example depicted in FIG. 6, the second end 172 of the heat pipe 162 is disposed in contact with a highly thermally conductive pad 604 that is in contact with the housing 602, for example, the bottom 606 of the housing 602. The thermally conductive pad 604 may be a metal sheet, such as a copper sheet, aluminum sheet, stainless steel sheet and the like. TIM, solder, brazing material or other thermally conductive material may be utilized to secure the second end 172 of the heat pipe 162 to the thermally conductive pad 604.

Figure 7:
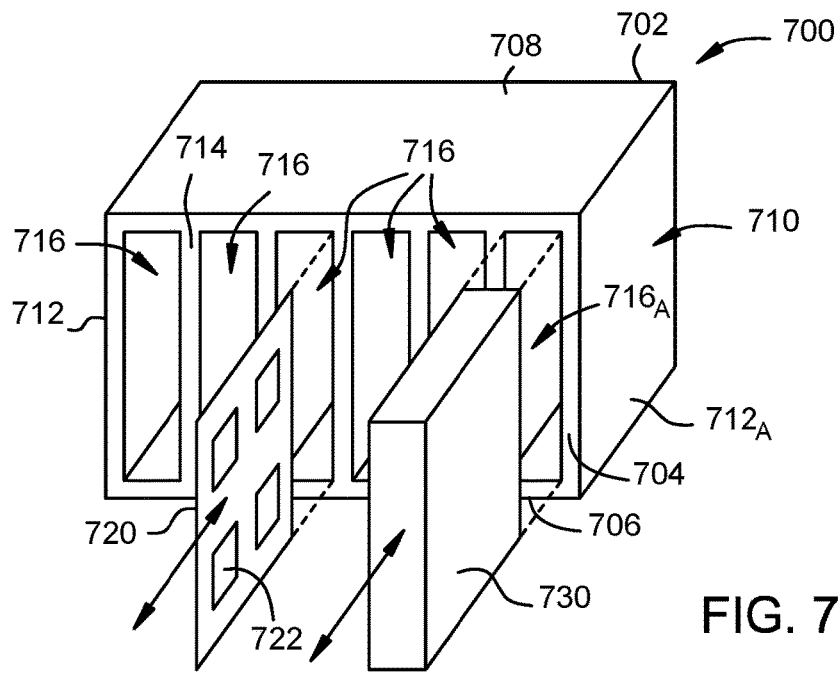
FIG. 7 is a front isometric view of an electronic cassette having a thermal capacitance element.

In operation, the thermally conductive pad 604 sinks heat from the ambient environment, the housing 610, the chip package 650 and other sources within the electronic device 600. The heat pipe 162 efficiently transfer heat from the pad 604 to the TCM 166 disposed in the thermal capacitance element 680. In this manner, the chip package 650 (and/or image acquiring device 624 or other heat sensitive component within the housing 602) is advantageously shielded from temperature rise, which allows the operation of the chip package 650 (and/or image acquiring device 624 or other heat sensitive component within the housing 602) to be extended for short periods beyond temperatures that would conventionally force the chip package 650 (and/or image acquiring device 624 or other heat sensitive component within the housing 602) to a state that exceed its rated maximum operating temperature FIG. 7 is a front isometric view of an electronic cassette 700 having a thermal capacitance element 730. The cassette 700 has a housing 710 comprised of lateral sidewalls 712, 712$_A$, a top 708, a bottom 706, a front 704 and a back 702. The housing 710 also includes a plurality of interior walls 714 extending between the top 708 and the bottom 706. A plurality of slots 716 are defined between the interior walls 714, and between the outer most interior walls 714 and the lateral sidewalls 712, 712$_A$. The slots 716 are open at least to the front 704 of the cassette 700, thus allowing printed circuit boards (PCBs) 720 including one or more chip packages 722 mounted thereon and the thermal capacitance element 730 to be removably stored in the slots 716 of the housing 710. At least one slot 716 is designated with the subscript A to indicate the slot 716$_A$ intended to receive the thermal capacitance element 730.

The cassette 700 is generally configured to channel heat away from the slots 716 containing PCBs 720 to the slot 716$_A$ having the thermal capacitance element 730 disposed therein. Since the cassette 700 preferentially directs heat to the thermal capacitance element 730, temperature rise in the PCBs 720 and chip packages 722 disposed in the other slots 716 of the cassette 700 is substantially slowed or prevented, thereby allowing the operation to be extended for short periods beyond temperatures that would conventionally force the IC dies within the chip packages 722 to a state that exceed their rated maximum operating temperatures.

The cassette 700 utilizes a plurality of heat pipes to direct the flow of heat within the housing 710. One exemplary configuration of the heat pipes is illustrated in FIGS. 8-11, as discussed below, although other configurations may be similarly utilized.

Figure 8:
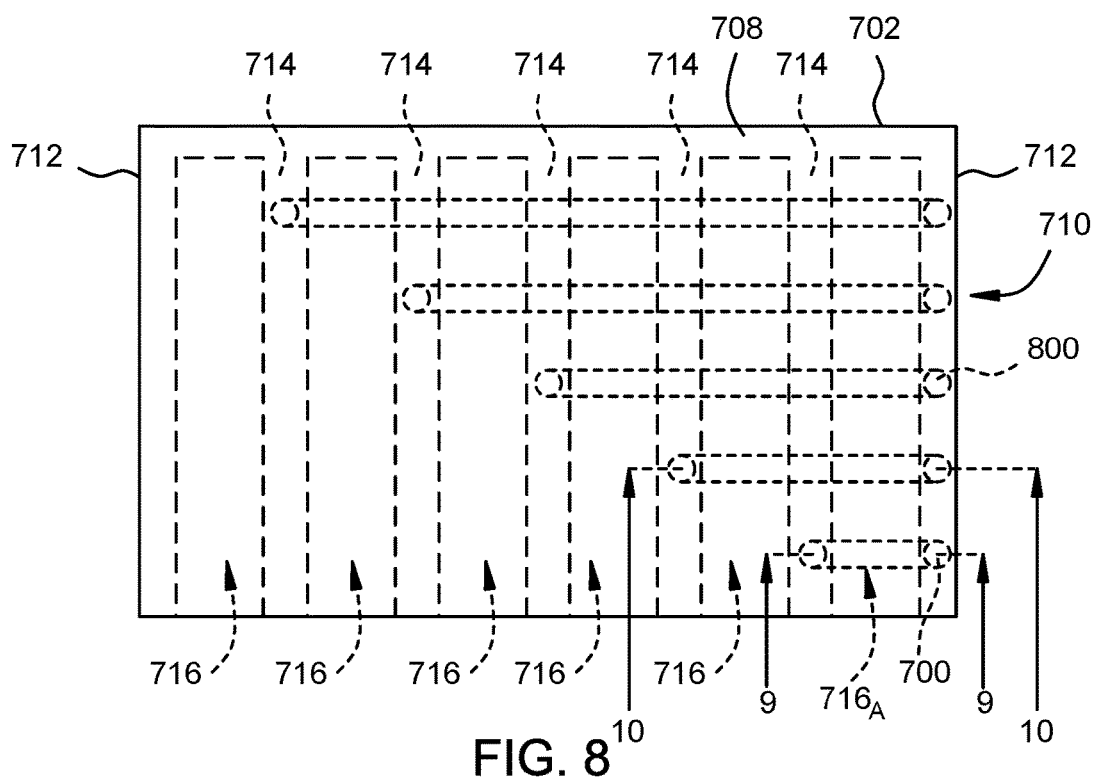
FIG. 8 is a top view of the electronic cassette of FIG. 7.

FIG. 8 is a top view of the electronic cassette 700 of FIG. 7 illustrating an exemplary layout of heat pipes 800 (shown in phantom). As seen in phantom through the top 708 of the housing 710, at least one heat pipe 800 runs between each interior wall 714 and one of the interior wall 714 and lateral sidewall 712$_A$ bounding the slot 716$_A$.

Figure 9:
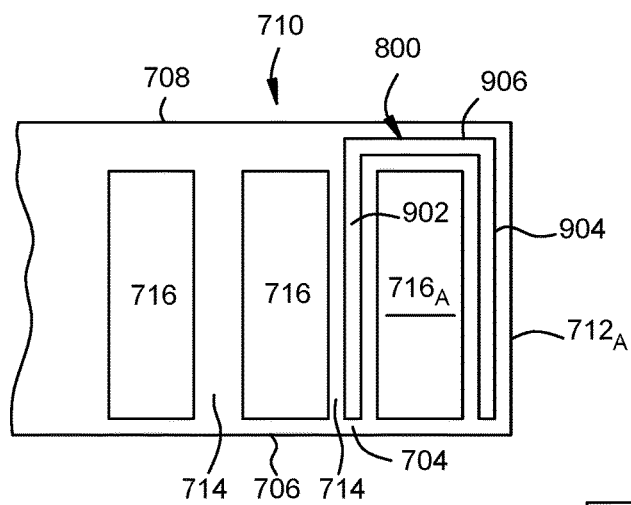
FIG. 9 is a sectional view of the electronic cassette taken along section line 9-9 of FIG. 7.
Figure 10:
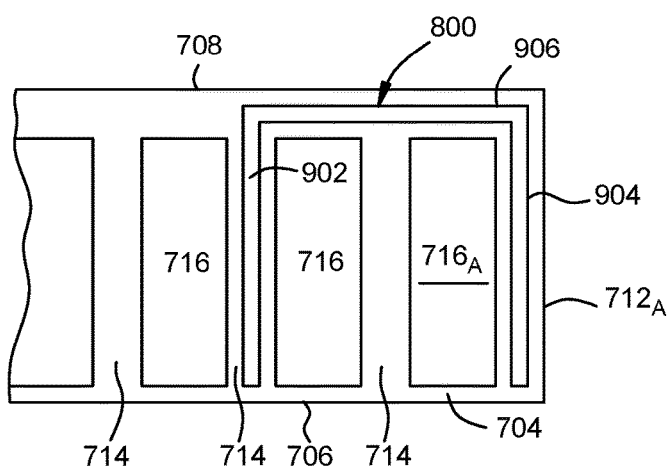
FIG. 10 is a sectional view of the electronic cassette taken along section line 10-10 of FIG. 7.

For example, as shown in the sectional views of FIGS. 9 and 10 taken respectively along section line 9-9 and section line 10-10 of FIG. 8, each heat pipe 800 has a first portion 902 is coupled to a second portion 904 by a connecting section 906. The first portion 902 is disposed in the interior wall 714. The second portion 904 is disposed in the lateral sidewall 712$_A$. The connecting section 906 is disposed in the top 708 of the housing 710, or alternatively, the connecting section 906 may be disposed in the back 702 or bottom 706 of the housing 710. Additionally, as discussed above, the second portion 904 may alternatively be disposed in the interior wall 714 that is adjacent the slot 716$_A$ instead of, or additionally to, being in the lateral sidewall 712$_A$ of the housing 710. The portion of the housing 710 in which the second portion 904 of the heat pipe 800 resides defines a heat transfer interface. The heat transfer interface may be in contact with, or in close proximity to, the thermal capacitance element 730 disposed in the slot 714$_A$, thereby enhancing heat transfer therebetween.

Thus, the configuration of the heat pipe 800 allows heat collected by the first portion 902 adjacent slots 716 containing PCBs 720 to be efficiently transferred to the second portion 904 disposed in the lateral sidewall 712$_A$ where the heat is readily adsorbed by the directly adjacent thermal capacitance element 730, and thus, directly adjacent the second portion 904 of the heat pipe 800. As a result of the efficient heat transfer to the thermal capacitance element 730 from the slot 716, rise in the operating temperature of the PCB 720 and IC dies of the chip packages 722 within the slot is substantially slowed or prevented from rising for a period of time which allows the operation of the device to be extended for short period beyond temperatures that would conventionally force the device (i.e., the IC dies of the chip packages 722) to a state that exceed its rated maximum operating temperature.

Figure 11:
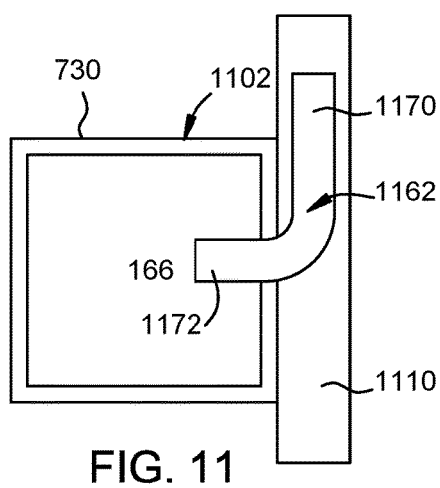
FIG. 11 is a sectional view of one embodiment of a thermal capacitance element that may be utilized with electronic cassette of FIG. 7.

FIG. 11 is a sectional view of one embodiment of the thermal capacitance element 730 that may be utilized with electronic cassette 700 of FIG. 7. The thermal capacitance element 730 may be generally similar to the thermal capacitance element 180 described above, having one or more containers 1102 that contains the TCM 166. The thermal capacitance element 730, although shown as removably disposed inside the cassette 700, it is contemplated that the container 1102 of the thermal capacitance element 730 may be part of or secured to the housing 710 of the cassette 700. It is contemplated that the thermal capacitance element 730 may be alternatively configure as taught by the other thermal capacitance elements described herein.

Optionally, the thermal capacitance element 730 may include a carrier plate 1110 to which the one or more containers 1102 that contains the TCM 166 are coupled. The carrier plate 1110 is sized to better support the thermal capacitance element 730 within the slot 714$_A$. Although only one containers 1102 is shown coupled to the plate 1110, it is contemplated that as many containers 1102 that may fit on the plate 1110 and still fit within the slot 714$_A$ may be utilized. The carrier plate 1110 may position the thermal capacitance element 730 immediately adjacent or in contact with the heat transfer interface of the housing 710. Alternatively, the carrier plate 1110 may be positioned immediately adjacent or in contact with the heat transfer interface of the housing 710.

In embodiments wherein the carrier plate 1110 may be positioned immediately adjacent or in contact with the heat transfer interface of the housing 710, a heat pipe 1162 may be utilized further enhance heat transfer from the heat transfer interface of the housing 710 through the carrier plate 1110 and into the container 1102. The heat pipe 1162 may be wholly contained within the carrier plate 1110. Alternatively, the heat pipe 1162 have a first end 1170 disposed in the carrier plate 1110 and a second end 1172 disposed in the container 1102. Having the second end 1172 disposed in the container 1102 and in contact with the TCM 166 increases the effectiveness of the thermal capacitance element 730 in maintaining the IC packages 722 below their maximum operating temperatures.

Thus, chip packages and electronic devices have been described above that include a thermal capacitance element. The thermal capacitance element leverages the use of a TCM to improves the operation of IC dies at elevated temperatures. The TCM functions to store thermal energy during a phase change to substantially slow or prevent temperature rise of the IC dies within the chip package, thereby allowing the operation of electronic devices to be extended for short periods beyond temperatures that would conventionally force the device to a state that exceed its rated maximum operating temperature. Moreover, keeping the device in a state below its rated maximum operating temperature maintains the functionality of the device in high temperature environments, while significantly reducing the potential for device and IC failure, enhancing device long term performance and increasing reliability.

In a first example, the technology described herein may be embodied as a device for receiving a plurality of printed circuit boards (PCBs), each PCB having at least one integrated circuit (IC) die. The device includes a chassis comprising a plurality of slots, the plurality of slots including at least a first slot configured to receive a thermal capacitance element and a group of slots each configured to receive a PCB; and a heat pipe integrated with the chassis, a portion of the heat pipe disposed adjacent each slot of the group slots for transferring heat away from the group of slots, the heat pipe terminating in a heat transfer interface disposed adjacent the first slot, the heat transfer interface configured to conductively contact a thermal capacitance element removably insertable into the first slot.

In a second example, the thermal capacitance element of the first example is disposed in the first slot, and wherein the thermal capacitance element comprises a container; and a capacitance material sealingly disposed in the container, the capacitance material having a phase transition temperature that is between 80 and 100 percent of a maximum designed operating temperature of the first IC die, wherein container, when received in the first slot, has an orientation that positions the container immediately adjacent to the heat transfer interface.

In a third example, the container of the second example contacts the heat transfer interface.

In a fourth example, the thermal capacitance element of the third example further includes a thermal capacitance element heat pipe coupled to the carrier plate and configured to transfer heat from the heat transfer interface to the container.

In a fifth example, the technology described herein may be embodied as a method for filling a container with a capacitance material. The method includes flowing a capacitance material into a first port of a container while having a second port disposed on the opposite side of the container vented; and once a sufficient amount of the capacitance material is disposed in the container, sealing the first port and sealing the second port.

In a sixth example, the capacitance material of the fifth example has a phase transition temperature that is between 343 and 398 degree degrees Kelvin, the capacitance material being in a solid state at a temperature of 343 degrees Kelvin.

In a seventh example, the method of the fifth example further comprises flowing the capacitance material between interleaving fins extending from opposite interior surfaces of the container.

In an eighth example, the method of the fifth example further comprises flowing the capacitance material between opposing interior textured surfaces of the container.

In a ninth example, the opposing interior textured surfaces of the container of the fifth example comprise at least one of grooves, holes, pillars and ridges, ribs, protrusions, fins, dimples, and divots.

In a tenth example, the technology described herein may be embodied as chip package. The chip package includes an integrated circuit (IC) die, a thermal conductive object thermally connected to the IC die, and a thermal capacitance element thermally connected to the thermal conductive object. The thermal capacitance element includes a capacitance material sealingly disposed in a container. The capacitance material has a phase transition temperature that is between 80 and 100 percent of a maximum designed operating temperature in degrees Kelvin of the IC die.

In an eleventh example, the capacitance material of the chip package of the tenth example is in a solid phase at a temperature of about 343 degrees Kelvin.

In a twelfth example, the capacitance material of the chip package of the tenth example is selected to be in either the solid phase or in a mixed phase of solid and liquid when a temperature of the IC die is rising but below the maximum operating temperature of the IC die.

In a thirteenth example, the capacitance material of the chip package of the tenth example is selected to be in a mixed phase of solid and liquid when a temperature of the IC die is in the range of above the target temperature of the capacitance material and the maximum operating temperature of the IC die.

In a fourteenth example, the capacitance material of the chip package of the tenth example is selected to be predominantly in the liquid phase when a temperature of the IC die is at the maximum operating temperature of the IC die.

In a fifteenth example, the target temperature of the capacitance material of the chip package of the tenth example is within about 80% or higher of the maximum operating absolute temperature of the IC die.

While the foregoing is directed to embodiments of the present disclosure, other and further embodiments may be devised without departing from the basic scope thereof, and the scope thereof is determined by the claims that follow.

What is claimed is:

1. A chip package comprising:
   a package substrate;
   an integrated circuit (IC) die coupled to the package substrate;
   a thermal conductive object thermally connected to the IC die, the thermal conductive object comprising a lid of the chip package coupled to the package substrate, the lid covering and sandwiching the IC die against the substrate; and
   a thermal capacitance element thermally connected to the lid of the chip package, the thermal capacitance element comprising:
      a container coupled to the lid of the chip package; and
      a thermal capacitance material sealingly disposed in the container, the capacitance material selected to change from a solid phase to a liquid phase at a target temperature of the thermal capacitance material that is below a maximum operating temperature of the IC die; and
   a heat pipe having a first end interfaced with a pad coupled to the thermally conductive object and a second end interfaced with the container.

2. The chip package of claim 1, wherein at least a portion the capacitance material will be in the solid phase in a temperature range defined between the lowest operating temperature of the IC die and the maximum operating temperature of the IC die.

3. The chip package of claim 1, wherein the capacitance material is a wax.

4. The chip package of claim 1 wherein the heat pipe extends through the lid.

5. The chip package of claim 1, wherein the heat pipe extends into the container.

6. The chip package of claim 1, wherein the heat pipe is in contact with an external side of the container.

7. The chip package of claim 1 further comprising:
   a conductive matrix disposed in the container, wherein the capacitance material is disposed in open areas of the matrix.

8. The chip package of claim 4, wherein the container is disposed on an exterior side of the lid.

9. The chip package of claim 1, wherein the container comprises:
   interleaving fins extending from opposing interior surfaces of container.

10. The chip package of claim 1, wherein the container comprises:
    at least one interior textured surface.

11. The chip package of claim 10, wherein the at least one interior textured surface of the container comprises:
    at least one of grooves, holes, pillars and ridges, ribs, protrusions, fins, dimples and divots.

12. The chip package of claim 1, wherein the thermally conductive object is a heat sink or is coupled to a heat sink.

13. The chip package of claim 12, wherein the heat sink comprises:
    a step having the container disposed thereon.

14. The chip package of claim 1 further comprising:
    a stiffener extending between the substrate and the lid, the stiffener circumscribing the container.

15. A chip package comprising:
    a package substrate;
    an integrated circuit (IC) die coupled to the package substrate;
    a thermal conductive object thermally connected to the IC die, the thermal conductive object comprising a lid of the chip package coupled to the package substrate, the lid covering and sandwiching the IC die against the substrate; and
    a thermal capacitance element thermally connected to the lid of the chip package, the thermal capacitance element comprising:
       a container coupled to the lid of the chip package; and
       a thermal capacitance material sealingly disposed in the container, the capacitance material selected to change from a solid phase to a liquid phase at a target temperature of the thermal capacitance material that is below a maximum operating temperature of the IC die, wherein the container is disposed on a die side of the lid between the lid and the package substrate.

16. The chip package of claim 15 further comprising:
    a heat pipe having a first end interfaced with a pad coupled to the thermally conductive object and a second end interfaced with the container.

17. A device having an integrated circuit (IC) die, the device comprising:
    a housing;
    a package substrate disposed in the housing;
    a first IC die mounted to the package substrate;
    a thermal capacitance element disposed in the housing and laterally spaced from the first IC die;
    a lid coupled to the package substrate, the lid covering and sandwiching the IC die against the substrate; and
    a heat pipe laterally coupling the thermal capacitance element to the lid, the heat pipe conductively connecting the first IC die to the thermal capacitance element, the thermal capacitance element comprising:
       a container coupled to the lid; and
       a thermal capacitance material sealingly disposed in the container, the capacitance material selected to change from a solid phase to a liquid phase at a target temperature of the thermal capacitance material that is below a maximum operating temperature of the IC die.

18. The device of claim 17 further comprising:
an image acquiring device disposed in the housing and communicatively coupled to the first IC die.

19. A device having an integrated circuit (IC) die, the device comprising:
a housing;
a package substrate disposed in the housing;
a first IC die mounted to the package substrate;
a thermal capacitance element disposed in the housing and conductively connected to the first IC die, the thermal capacitance element comprising:
a container; and
a thermal capacitance material sealingly disposed in the container, the capacitance material selected to change from a solid phase to a liquid phase at a target temperature of the thermal capacitance material that is below a maximum operating temperature of the IC die; and
wherein the housing further comprises:
a plurality of slots including at least a first slot and a second slot, wherein the container of the thermal capacitance element is removably disposed in the first slot of the housing and the first IC die is removably disposed in the second slot of the housing; and
a first heat pipe configured to transfer heat generated in the slots of the housing to the thermal capacitance element.

20. The device of claim 19 further comprising:
a second heat pipe configured to transfer heat from the first IC die to the thermal capacitance element.

21. A device having an integrated circuit (IC) die, the device comprising:
a housing;
a package substrate disposed in the housing;
a first IC die mounted to the package substrate;
a thermal capacitance element disposed in the housing and conductively connected to the first IC die;
a lid coupled to the package substrate, the lid covering and sandwiching the IC die against the substrate, the thermal capacitance element comprising:
a container coupled to the lid; and
a thermal capacitance material sealingly disposed in the container, the capacitance material selected to change from a solid phase to a liquid phase at a target temperature of the thermal capacitance material that is below a maximum operating temperature of the IC die; and
a stiffener extending between the substrate and the lid, the stiffener circumscribing the container.

* * * * *